United States Patent
Aoki et al.

(10) Patent No.: US 7,928,730 B2
(45) Date of Patent: Apr. 19, 2011

(54) ELECTROMAGNET APPARATUS GENERATING A HOMOGENEOUS MAGNETIC FIELD WITH FERROMAGNETIC MEMBERS ARRANGED INSIDE CRYOGENIC VESSELS

(75) Inventors: Manabu Aoki, Ibaraki (JP); Mitsushi Abe, Ibaraki (JP); Takeshi Nakayama, Ibaraki (JP); Masanori Takahashi, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 151 days.

(21) Appl. No.: 11/624,543

(22) Filed: Jan. 18, 2007

(65) Prior Publication Data

US 2007/0170921 A1    Jul. 26, 2007

(30) Foreign Application Priority Data

Jan. 23, 2006    (JP) ................. 2006-013575

(51) Int. Cl.
   *G01V 3/00*    (2006.01)
   *G01R 33/38*    (2006.01)
   *H01F 1/00*    (2006.01)

(52) U.S. Cl. ........ 324/318; 324/319; 324/320; 335/216; 335/301

(58) Field of Classification Search .......... 324/300–322; 310/10, 52, 269, 877, 40 R; 74/5.46, 5.7, 74/5 R; 600/410, 411; 335/216, 296–306
See application file for complete search history.

(56) References Cited

U.S. PATENT DOCUMENTS

| | | | | |
|---|---|---|---|---|
| 3,044,309 A | * | 7/1962 | Buchhold | 74/5.46 |
| 4,058,746 A | * | 11/1977 | Mole et al. | 310/10 |
| 4,766,378 A | * | 8/1988 | Danby et al. | 324/307 |
| 5,194,810 A | | 3/1993 | Breneman et al. | 335/202 |
| 5,463,364 A | | 10/1995 | Mueller | 335/299 |
| 6,100,780 A | * | 8/2000 | Dorri et al. | 335/216 |
| 6,169,404 B1 | | 1/2001 | Eckels | 324/320 |
| 6,570,475 B1 | | 5/2003 | Lvovsky et al. | 335/216 |

(Continued)

FOREIGN PATENT DOCUMENTS

EP    1154280    11/2001

(Continued)

OTHER PUBLICATIONS

Zhao, Huawei et al, "A design method for superconducting MRI magnets with ferromagnetic material", Meas. Sci. Technol., vol. 13, No. 12, Dec. 12, 2002, pp. 2047-2052.

*Primary Examiner* — Melissa J Koval
*Assistant Examiner* — Tiffany A Fetzner
(74) *Attorney, Agent, or Firm* — Mattingly & Malur, P.C.

(57) ABSTRACT

The electromagnet apparatuses generate a homogeneous magnetic field in a homogeneous magnetic field region by a pair of superconductive main coils for facing to each other; a pair of superconductive shielding coils for facing to each other and passing a current in a direction reverse to that of the main coils; and a pair of first ferromagnetic members for facing to each other, and the apparatuses further include a pair of second ferromagnetic members for facing to each other and be disposed in contact with or adjacent to an opposite side of the region side of the first ferromagnetic members, wherein the region is interposed between the main coils, between the shielding coils, between the first members whose outer periphery is a circle, and between the second members whose outer periphery is a circle whose diameter is larger than that of the circle of the first members.

16 Claims, 10 Drawing Sheets

U.S. PATENT DOCUMENTS

| | | |
|---|---|---|
| 6,861,933 B1 | 3/2005 | Yoshida et al. ............... 335/301 |
| 7,071,694 B1 * | 7/2006 | Kruip ........................... 324/323 |
| 7,242,191 B2 | 7/2007 | Laskaris et al. |
| 7,274,192 B2 | 9/2007 | Havens |
| 7,560,929 B2 * | 7/2009 | Hsieh et al. ................... 324/318 |
| 2007/0170921 A1 * | 7/2007 | Aoki et al. .................... 324/319 |
| 2008/0036463 A1 * | 2/2008 | Hsieh et al. ................... 324/319 |
| 2009/0256663 A1 * | 10/2009 | Hsieh et al. ................... 335/216 |

FOREIGN PATENT DOCUMENTS

| | | |
|---|---|---|
| JP | 2001-224571 A | 8/2001 |
| JP | 2003-513436 | 4/2003 |
| JP | 2005/118098 | 5/2005 |
| JP | 2006-102060 | 4/2006 |
| WO | 01/31359 | 5/2001 |

\* cited by examiner

ELECTROMAGNET APPARATUS GENERATING A HOMOGENEOUS MAGNETIC FIELD WITH FERROMAGNETIC MEMBERS ARRANGED INSIDE CRYOGENIC VESSELS

BACKGROUND OF THE INVENTION

1. Field of the Invention

The present invention relates to an electromagnet apparatus and a magnetic resonance imaging system (hereinafter referred to as MRI system) using the electromagnet apparatus.

2. Description of the Related Art

An MRI system measures an electromagnetic wave which a hydrogen nuclear spin discharges by a nuclear magnetic resonance phenomenon (hereinafter referred to as NMR), processes the electromagnetic wave as a signal, and thereby makes a tomogram of an inside of a patient body by a hydrogen nucleus density. In order to measure the electromagnetic wave discharged by the hydrogen nuclear spin, it is necessary to generate a homogeneous magnetic field region that has a high strength (not less than 0.2 T) and a high homogeneity of a static magnetic field.

Because a strength of a magnetic field due to an electromagnetic wave discharged by a hydrogen nuclear spin is proportional to that of a static magnetic field in a homogeneous magnetic field region, it is also necessary to increase a strength of the static magnetic field in order to enhance a resolution of a tomogram. Furthermore, in order to make the tomogram have a high image quality and a high resolution and to make a strain thereof none, it is also necessary to heighten a magnetic field homogeneity of the homogeneous magnetic field region. Then as a method of increasing the strength of the static magnetic field of the homogeneous magnetic field region and heightening the magnetic field homogeneity of the region is disclosed an example of using a ferromagnetic member (for example, see Published Japanese translation of PCT international publication for Patent Application Ser. No. 2003-513436 (paragraphs 0018 to 0019, FIG. 3).

The longer a distance from a superconductive coil becomes, the smaller and the more inhomogeneous a magnetic field strength of a static magnetic field generated by the superconductive coil of an electromagnet apparatus becomes; however, it is possible to dispose a ferromagnetic member in the static magnetic field and to heighten the magnetic field homogeneity.

However, it is thought that: considering a magnetic circuit, because a ferromagnetic member lowers a magnetic reluctance, magnetic flux lines tend to further concentrate on the ferromagnetic member placed near a superconductive coil where a magnetic path is short and the magnetic flux lines tend to concentrate before the placement, and thereby the ferromagnetic member becomes a state of a magnetic saturation; whereas the magnetic flux lines become difficult to concentrate on a ferromagnetic member placed away from the superconductive coil, and the ferromagnetic member becomes a state of a magnetic unsaturation.

Consequently, such an electromagnet apparatus is requested that enables also a ferromagnetic member placed away from a superconductive coil to be magnetically saturated, can lessen a magnetization variation of a ferromagnetic member due to a magnetic unsaturation, and can shorten work hours for shimming.

SUMMARY OF THE INVENTION

The present invention is electromagnet apparatuses configured to generate a homogeneous magnetic field in a homogeneous magnetic field region by a pair of superconductive main coils for facing to each other, wherein the region is interposed between the main coils; a pair of superconductive shielding coils for facing to each other and passing a current in a direction reverse to that of the superconductive main coils, wherein the region is interposed between the shielding coils; and a pair of first ferromagnetic members for facing to each other, wherein the homogeneous magnetic field region is interposed between the first ferromagnetic members of which an outer periphery is a circle, and the apparatuses further comprise a pair of second ferromagnetic members configured disposed opposite each other and in contact with or adjacent to an opposite side of a homogeneous magnetic field region side of the first ferromagnetic members, wherein the homogeneous magnetic field region is interposed between the second ferromagnetic members of which an outer periphery is a circle of which a diameter is larger than that of the circle of the first ferromagnetic members.

BEST MODE FOR CARRYING OUT THE INVENTION

Here will be described embodiments of the present invention in detail, referring to drawings as needed.

First Embodiment

Figure 1:
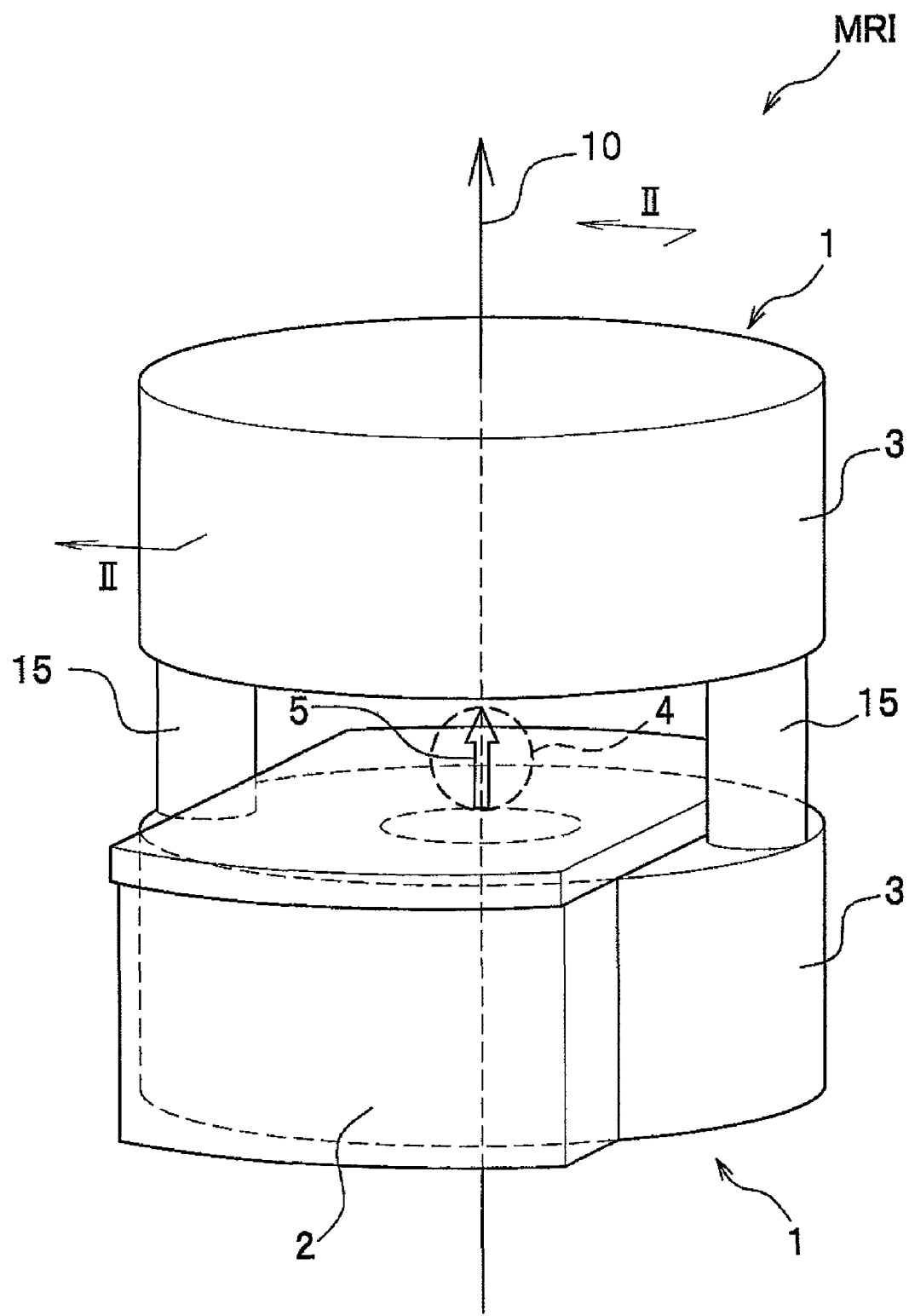
FIG. 1 is a bird's eye view of a magnetic resonance imaging system with respect to an embodiment of the present invention.

As shown in FIG. 1, an MRI system shown as MRI with respect to a first embodiment of the present invention comprises electromagnet apparatuses 1 and columns 15 for supporting the apparatuses 1, and a bed 2 disposed between the apparatuses 1. The apparatuses 1 are approximately an axial rotation symmetry in their form with respect to a central axis 10. Between the electromagnet apparatuses 1, it is possible to generate a homogeneous magnetic field region 4 where a strength of a static magnetic field is a high strength of not less than 0.2 T, which has a high static magnetic field homogeneity, and where a direction of magnetic flux lines is parallel to the central axis 10. In order to make a tomogram of an inside of a patient body according to a hydrogen nucleus density, the patient is carried on the bed 2, an inspection area is moved to the homogeneous magnetic field region 4, thereby an electromagnetic wave is measured that is discharged from the inside of the patient body by a hydrogen nuclear spin, the electromagnetic wave is processed as a signal, and thus the tomogram of the inside of the patient body is made according to the hydrogen nucleus density.

Figure 2:
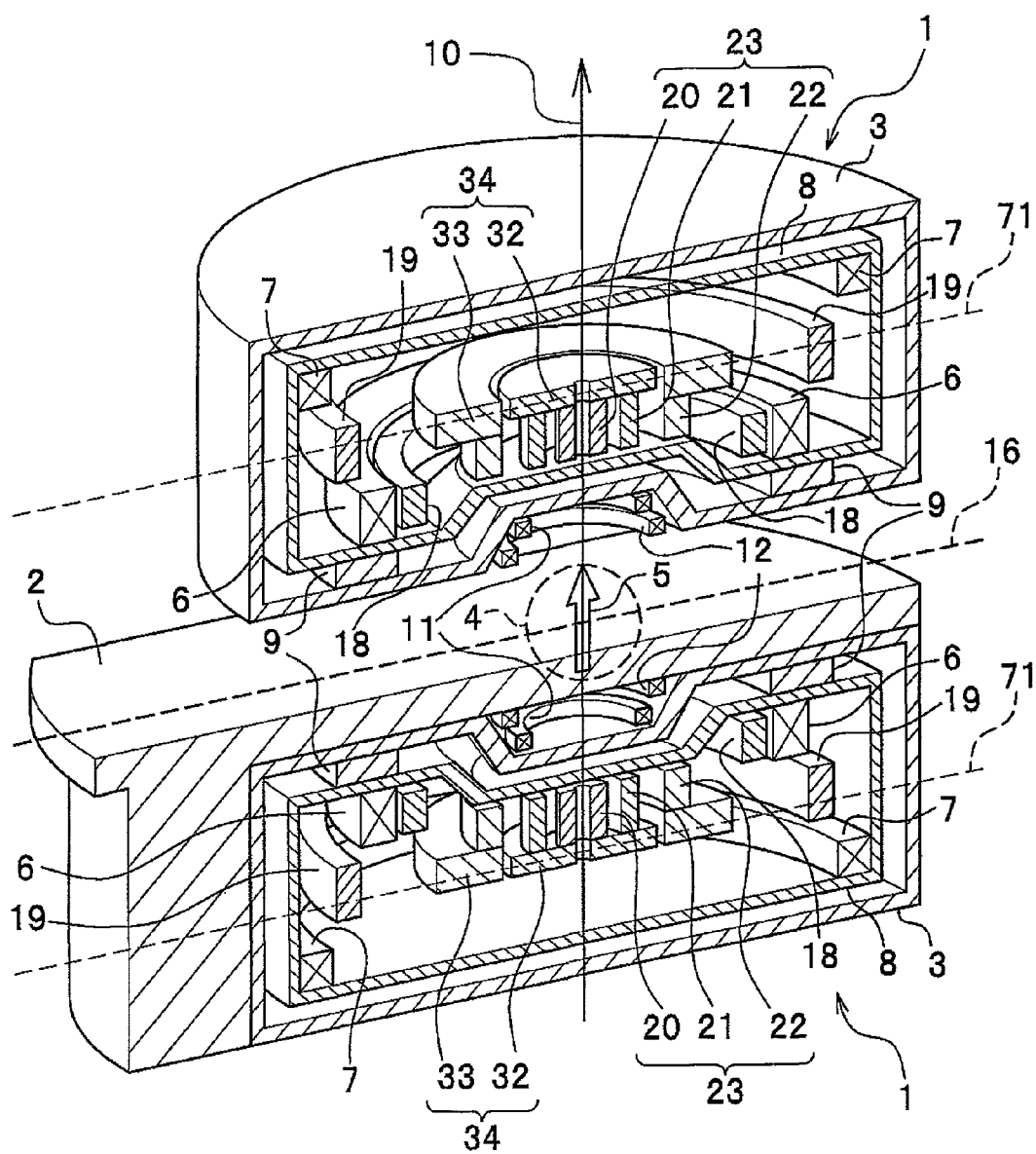
FIG. 2 is a section view in an II-II direction of the magnetic resonance imaging system in FIG. 1 with respect to a first embodiment.
Figure 3:
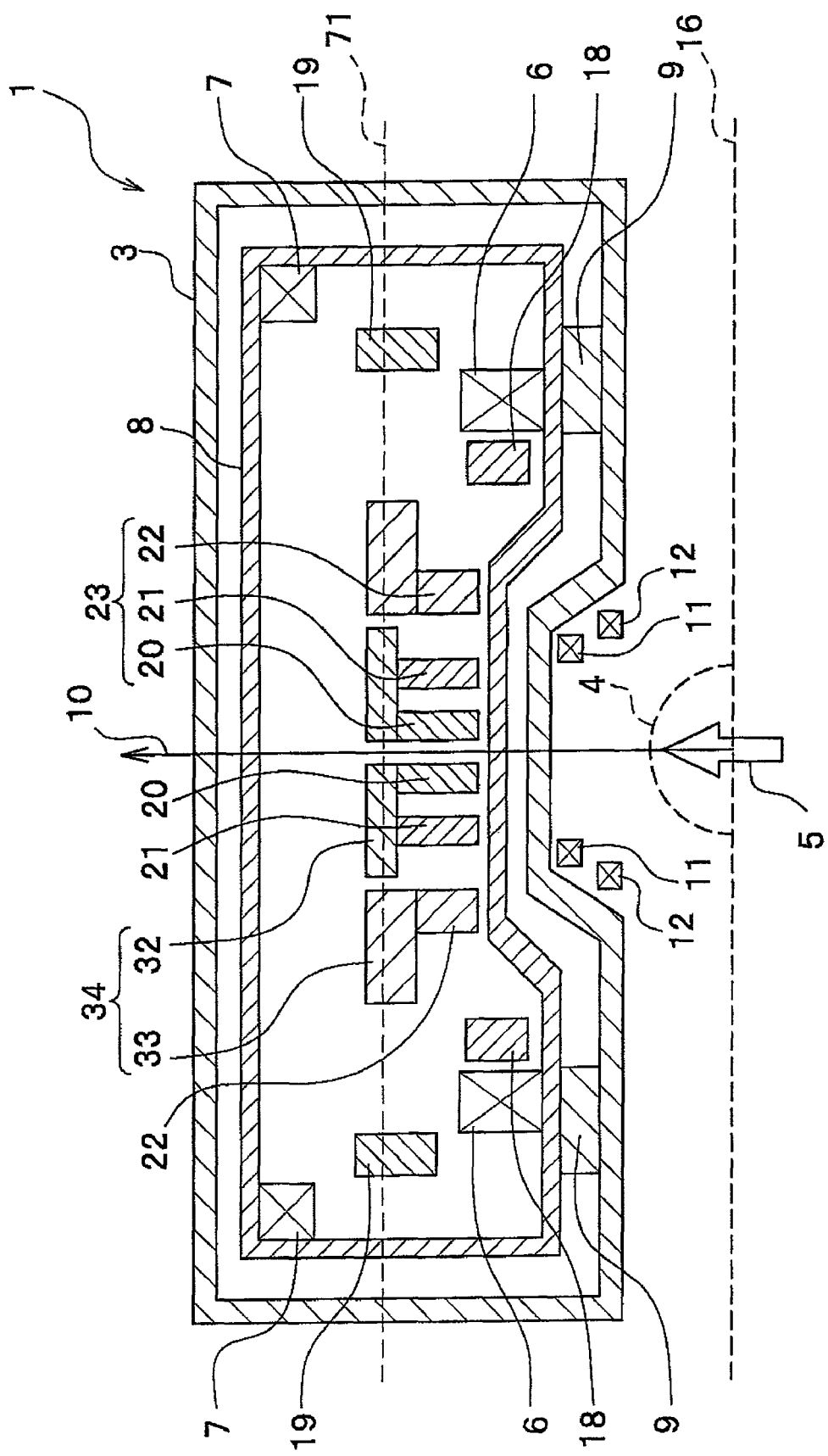
FIG. 3 shows an upper half of an electromagnet apparatus used in the magnetic resonance imaging system with respect to the first embodiment and is a section view in the II-II direction of FIG. 1.

As shown in FIGS. 2 and 3, in the MRI system are used the electromagnet apparatuses 1, a pair of gradient magnetic field coils 11, and a pair of radio frequency radiation coils 12. The pair of the gradient magnetic field coils 11 are placed so that the homogeneous magnetic field region 4 is interposed between the coils 11 and so as to be disposed opposite each other at a region 4 side of vacuum vessels 3. Furthermore, the radio frequency radiation coils 12 are also placed so that the homogeneous magnetic field region 4 interposed between the coils 12 and so as to disposed opposite each other at the region 4 side of the vacuum vessels 3.

In order to make a tomogram of an inside of a patient body according to a hydrogen nucleus density, the homogeneous magnetic field region 4 is generated by the electromagnet apparatuses 1, and a gradient magnetic field where a magnetic field is spatially changed is applied to the generated homogeneous magnetic field region 4, using the gradient magnetic field coils 11 for the purpose of obtaining positional information of the homogeneous magnetic field region 4 generated. Moreover, using the radio frequency radiation coils 12, an electromagnetic wave of a resonant frequency for causing an NMR phenomenon is applied to the homogeneous magnetic field region 4. According to these is measured an electromagnetic wave discharged by a hydrogen nuclear spin for every micro region within the homogeneous magnetic field region 4, and the calculation processing of the electromagnetic wave is performed, making the wave a signal, and thereby a tomogram of an inside of a patient body is made according to a hydrogen nucleus density.

The electromagnet apparatuses 1 are disposed approximately an axial rotation symmetry with respect to the central axis 10 and approximately a plane symmetry with respect to a symmetry plane including a line 16, wherein the homogeneous magnetic field region 4 is interposed between the apparatuses 1. The electromagnet apparatuses 1 comprises a pair of superconductive main coils 6, a pair of superconductive shielding coils 7, a plurality of first ferromagnetic members 23 (20, 21, 22), a plurality of second ferromagnetic members 34 (32, 33), a pair of third ferromagnetic members 18, a pair of fourth ferromagnetic members 19, cryogenic vessels 8, and vacuum vessels 3. Although the electromagnet apparatuses 1 generate a homogeneous magnetic field in the homogeneous magnetic field region 4 by the pair of the superconductive main coils 6 facing to each other, wherein the homogeneous magnetic field region 4 is interposed between the main coils 6; the pair of the superconductive shielding coils 7 facing to each other, wherein the homogeneous magnetic field region 4 is interposed between the shielding coils 7 and a current is passed in a direction reverse to that of the coils 6; and a pair of first ferromagnetic members 23 disposed opposite each other, wherein the homogeneous magnetic field region 4 is interposed between the members 23 of which an outer periphery is a circle, the apparatuses 1 further comprise a pair of second ferromagnetic members 34 disposed opposite each other, wherein the region 4 is interposed between the members 34 disposed so as to be in contact with or adjacent to an opposite side of a region 4 side of the members 23, and an outer periphery of the members 34 is a circle of which a diameter is larger than that of a circle of the members 23. In accordance with the second ferromagnetic members 34, because it is possible to capture magnetic flux lines leaking from the first ferromagnetic members 23 and to lead the flux lines in a radial direction, it is possible to reduce and make a magnetic reluctance of a magnetic circuit constant which the reluctance is via any first ferromagnetic member 23 placed anywhere in the radial direction and to make a magnetic flux density homogeneous.

A pair of the vacuum vessels 3 are symmetrically disposed, wherein the homogeneous magnetic field region 4 is interposed between the vessels 3. A space between the pair of the vacuum vessels 3 is supported and coupled with a coupling structure housed in the columns 15. The pair of the vacuum vessels 3 include a pair of the cryogenic vessels 8, respectively, and are insulated from outside. Each one of the pair of the cryogenic vessels 8 includes each one of the pair of the superconductive main coils 6 and the pair of the superconductive shielding coils 7, and reserves, for example, liquid helium as a refrigerant. Accordingly, the superconductive main coils 6 and the superconductive shielding coils 7 can be cooled to an ultra low temperature requested to maintain a superconductive state. The cryogenic vessels 8 are supported against the vacuum vessels 3 through insulation support members 9 that are provided between the vessels 3 and themselves and of which a heat resistance is large.

The pair of the superconductive main coils 6 are a generation source of a static magnetic field, and in the homogeneous magnetic field region 4, generate the static magnetic field of which magnetic flux lines are in a direction of an arrow mark 5. The pair of the superconductive main coils 6 are face to each other, wherein the homogeneous magnetic field region 4 is interposed between the main coils 6.

The pair of the superconductive shielding coils 7 also face to each other, wherein the homogeneous magnetic field region 4 is interposed between the shielding coils 7. Through the pair of the superconductive shielding coils 7 is passed a current in a direction reverse to that of the superconductive main coils 6 for a purpose of suppressing a leakage magnetic field. Each of the pair of the superconductive main coils 6 and each of the pair of the superconductive shielding coils 7 are circular rings of which the central axis 10 is common.

The vacuum vessels 3 and the cryogenic vessels 8 include the first ferromagnetic members 23, the second ferromagnetic members 34, the third ferromagnetic members 18, and the fourth ferromagnetic members 19. Although a space between the plurality of the second ferromagnetic members 34 (32, 33) is filled with a refrigerant, it may also be filled with a non-magnetic member.

A plurality of the first ferromagnetic members 23 (20, 21, 22) face to each other and become pairs, respectively, wherein the homogeneous magnetic field region 4 is interposed between the members 23 (20, 21, 22). A plurality of the second ferromagnetic members 34 (32, 33) also face to each other and become pairs, respectively, wherein the homogeneous magnetic field region 4 is interposed between the members 34 (32, 33).

The plurality of the second ferromagnetic members 34 are disposed so as to be in contact with or adjacent to respective opposite sides of homogeneous magnetic field region 4 sides of the plurality of the first ferromagnetic members 23. The second ferromagnetic members 34 are disposed so as to respectively include a pair of planes 71 of which a normal line is the central axis 10. The second ferromagnetic members 34 are disposed at heights between the superconductive main coils 6 and the superconductive shielding coils 7, respectively.

The pair of the third ferromagnetic members 18 are respectively disposed outside the first ferromagnetic members 23 and inside the superconductive main coils 6. The pair of the third ferromagnetic members 18 are circular rings that face to each other, wherein the homogeneous magnetic field region 4 is interposed between the members 18.

The pair of the fourth ferromagnetic members 19 are respectively provided near the superconductive main coils 6 and the superconductive shielding coils 7. The pair of the fourth ferromagnetic members 19 capture magnetic flux lines made by the superconductive shielding coils 7, and thereby, can avoid a magnetic field generated in the homogeneous magnetic field region 4 by the superconductive main coils 6 from being reduced by a magnetic field generated by the superconductive shielding coils 7. The pair of the fourth ferromagnetic members 19 are respectively disposed outside the second ferromagnetic members 34 and at heights between the superconductive main coils 6 and the superconductive shielding coils 7. The pair of the fourth ferromagnetic members 19 are circular rings that face to each other, wherein the homogeneous magnetic field region 4 is interposed between the members 19. The pair of the fourth ferromagnetic members 19 are disposed so as to include respective planes 71.

Figure 4A:
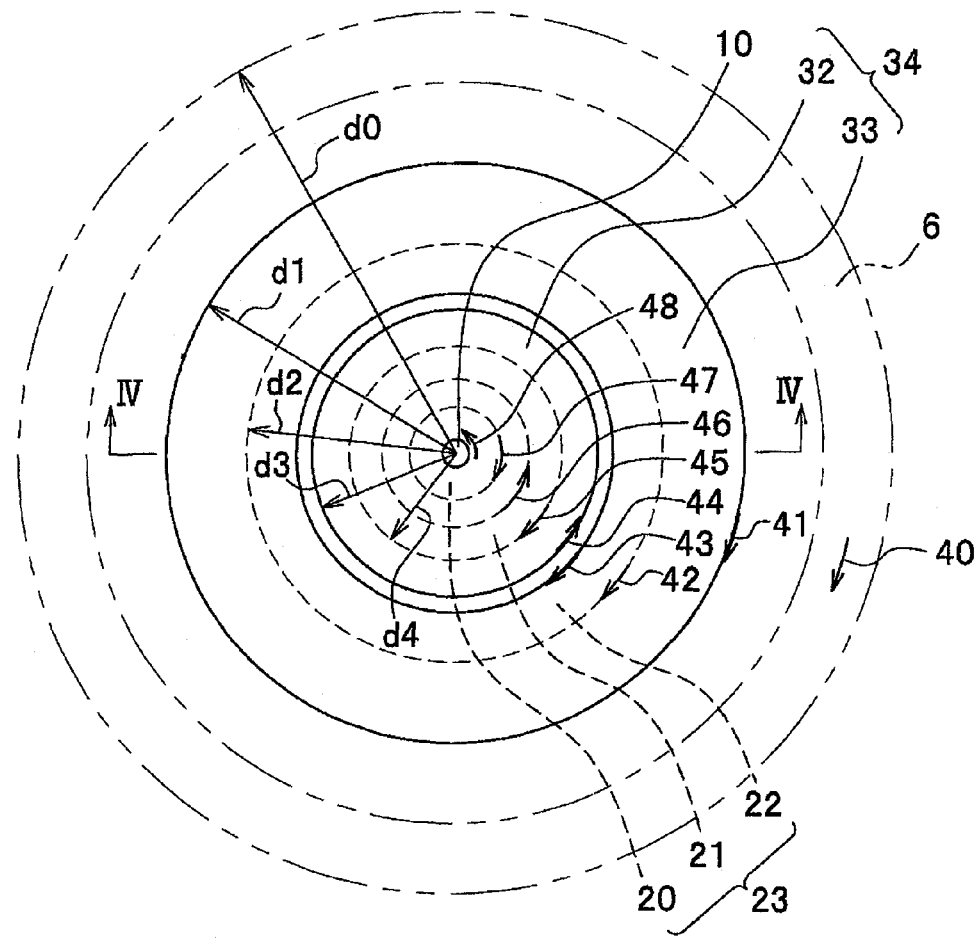
FIG. 4A shows a top view of a first ferromagnetic member and second ferromagnetic member of the upper half electromagnet apparatus with respect to the first embodiment.
Figure 4B:
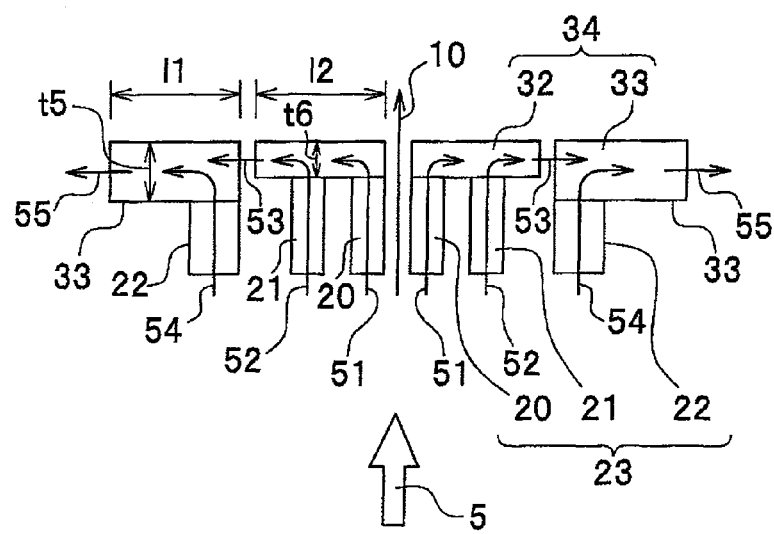
FIG. 4B is a section view in a IV-IV direction of FIG. 4A.

As shown in FIGS. 4A and 4B, in the plurality of the first ferromagnetic members 23 (20, 21, 22), a circular ring 20 is disposed in center, and circular rings 21, 22 are disposed in periphery. Inside the circular ring 22 is disposed the circular ring 21; inside the circular ring 21 is disposed the circular ring 20. The central axis 10 is a common central axis of the circular rings 20, 21, and 22 of the first ferromagnetic member 23.

The plurality of the second ferromagnetic members 34 (32, 33) comprise a circular ring 32 disposed in center and a circular ring 33 disposed in periphery. The central axis 10 is a common central axis of the circular rings 32 and 33 of the second ferromagnetic member 34. The circular ring 33 is in contact with or adjacent to the circular ring 22 of the first ferromagnetic member 23. The circular ring 32 is in contact with or adjacent to the circular rings 21 and 20 of the first ferromagnetic member 23. An outer diameter d1 of the circular ring 33 in contact with or adjacent to the circular ring 22 of the first ferromagnetic member 23 is larger than an outer diameter d2 of the ring 22. An outer diameter d3 of the circular ring 32 in contact with or adjacent to the circular ring 21 of the first ferromagnetic member 23 is larger than an outer diameter d4 of the ring 21. The outer diameter d1 of the circular ring 33 of the second ferromagnetic member 34 is smaller than an outer diameter d0 of the superconductive main coil 6. An inner diameter of the circular ring 33 in contact with or adjacent to the circular ring 22 of the first ferromagnetic member 23 is equal to that of the ring 22. An inner diameter of the circular ring 32 in contact with or adjacent to the circular ring 20 of the first ferromagnetic member 23 is equal to that of the ring 20.

The circular ring 32 is adjacently disposed inside the circular ring 33, and an inner peripheral face of the ring 33 and an outer peripheral face of the ring 32 are adjacent to each other. A space between the inner peripheral face of the circular ring 33 and the outer peripheral face of the circular ring 32 may also be filled with a nonmagnetic member. In a case of the first ferromagnetic member 23 and the second ferromagnetic member 34 being in contact with each other, the inner peripheral face of the circular ring 33 and the outer peripheral face of the circular ring 32 may also be joined and integrated; in a case of the member 23 and the member 34 being in contact with each other, the space between the inner peripheral face of the ring 33 and the outer peripheral face of the ring 32 may also be filled with a nonmagnetic member. Furthermore, a space between an inner peripheral face of the circular ring 32 and the central axis 10 may also be filled with a nonmagnetic member. In addition, the adjacency may be away to an extent of being able to be magnetically coupled.

The circular rings 20, 21, and 22 of the first ferromagnetic member 23, the circular rings 32 and 33 of the second ferromagnetic member 34, the third ferromagnetic member 18, and the fourth ferromagnetic member 19 in FIG. 3 are magnetized by a static magnetic field generated by the superconductive main coil 6 and the superconductive shielding coil 7. Accordingly, surface magnetizing currents flow on surfaces of the circular rings 20, 21, and 22 of the first ferromagnetic member 23, the circular rings 32 and 33 of the second ferromagnetic member 34, the third ferromagnetic member 18, and the fourth ferromagnetic member 19. Particularly as shown in FIGS. 4A and 4B, the circular rings 20, 21, and 22 of the first ferromagnetic member 23 provided near the homogeneous magnetic field region 4 are magnetized in a direction approximately parallel to the central axis 10 before arrow marks 51, 52, and 54 curving; and the surface magnetizing currents flow thereon. On the outer peripheral faces of the circular rings 20, 21, and 22 flow surface magnetizing currents of directions 47, 45, and 42 equal to a direction 40 of a current flowing in the neighboring superconductive main coil 6; on the inner peripheral faces thereof flow surface magnetizing currents of directions 48, 46, and 43 reverse to the directions 47, 45, and 42 of the surface magnetizing currents flowing on the outer peripheral faces thereof. These are equivalent to coils being newly disposed on respective inner and outer peripheral faces of the circular rings 20, 21, and 22. On the other hand, because the circular rings 32 and 33 of the second ferromagnetic member 34 are magnetized in directions approximately orthogonal to the central axis 10 after the arrow marks 51, 52, and 54 curving, the surface magnetizing currents do not flow in directions 41, 44.

It is preferable that ratios (l1/t5, l2/t6) of radial direction lengths l1, l2 of the circular rings 32, 33 of the second ferromagnetic member 34 to thicknesses t5, t6 of the rings 32, 33 are one or more. Assuming that a thickness direction of the circular rings 32, 33 is a short axis and a radial direction thereof is a long axis, if a length ratio of the long axis to the short axis is not less than ten times, a demagnetizing factor tends to become smaller, about 0.01 to 0.02 times. This tendency is obtained if the ratio is made not less than one time. If the tendency is obtained, a demagnetizing field acting so as to cancel a magnetization in the radial direction is lessened, the circular rings 32, 33 are easy to be magnetized in the radial direction, and it is possible to permeate magnetic flux lines without widely reducing them by the demagnetizing field. In other words, it is possible to lead the magnetic flux lines to arrow marks 55 without leaking the flux lines entered from the arrow marks 51, 52, and 54. Thus it is possible to magnetically saturate the circular rings 32, 33.

As shown in FIG. 4B, because the first ferromagnetic member 23 and the second ferromagnetic member 34 are in contact with or adjacent to each other, they are in a state of being magnetically coupled, and magnetic paths indicated by the arrow marks 51, 52, and 54 are formed between the members 23 and 34. Furthermore, because an interval between the circular rings 32 and 33 of the second ferromagnetic member 34 is narrower than that between the circular rings 22 and 21 of the first ferromagnetic member 23 and is adjacent, magnetic paths indicated by arrow marks 53 are also formed between the circular rings 32 and 33. Accordingly, the magnetic flux lines of the arrow marks 51 that have entered the circular ring 20 enter the circular ring 33 through the circular ring 32 without leaking, and pass through in directions of the arrow marks 55. Similarly, the magnetic flux lines of the arrow marks 52 that have entered the circular ring 21 also enter the circular ring 33 through the circular ring 32 without leaking, and pass through in directions of the arrow marks 55. The circular rings 32 and 33 of the second ferromagnetic member 34 are thus disposed, and thereby it is possible to reduce the leakage of the magnetic flux lines and to suppress a leakage magnetic field.

Generally, the longer a distance from the superconductive main coil 6 becomes, the smaller a magnetic field strength generated by the coil 6 becomes. Accordingly, depending on a static magnetic field generated only by the superconductive main coil 6, the magnetic field strength is lessened in the circular ring 20 near the central axis 10; the magnetic field strength is intensified in the circular ring 22 near the superconductive main coil 6. This is because a difference of a magnetic resistance occurs depending on the distance from the superconductive main coil 6. The circular rings 32 and 33 of the second ferromagnetic member 34 are disposed, and thereby, it is thought that the magnetic resistance of a magnetic circuit passing through the circular ring 20 near the central axis 10 and that of a magnetic circuit passing through the circular ring 22 near the superconductive main coil 6 also lower to a same extent and have become approximately equal. In other words, it is thought that a magnetic resistance of magnetic paths (magnetic paths from the arrow marks 51 to the arrow marks 55 via the arrow marks 53) via the circular ring 20 of the first ferromagnetic member 23 is reduced and has become a same extent as a magnetic resistance of magnetic paths (magnetic paths from the arrow marks 54 to the arrow marks 55) via the circular ring 22 of the member 23. Similarly, it is thought that a magnetic resistance of magnetic paths (magnetic paths from the arrow marks 52 to the arrow marks 55 via the arrow marks 53) via the circular ring 21 of the first ferromagnetic member 23 is reduced and has become the same extent as the magnetic resistance of the magnetic paths via the circular ring 22 of the member 23. Accordingly, it is thought that the magnetic paths via the circular ring 20, via the circular ring 21, and via the circular ring 22 of the first ferromagnetic member 23 become the same extent in magnetic resistance; and that magnetic flux lines are also distributed according to a magnetic flux density of a same extent. Thus it is possible to make a magnetic field strength homogeneous without depending on a distance from the superconductive main coil 6. Because it is possible to homogeneously increase the magnetic field strength by increasing the current of the superconductive main coil 6, it is possible to magnetically saturate all of the circular rings 20, 21, and 22 and to lessen a magnetization variation of the first ferromagnetic member 23.

Figure 5:
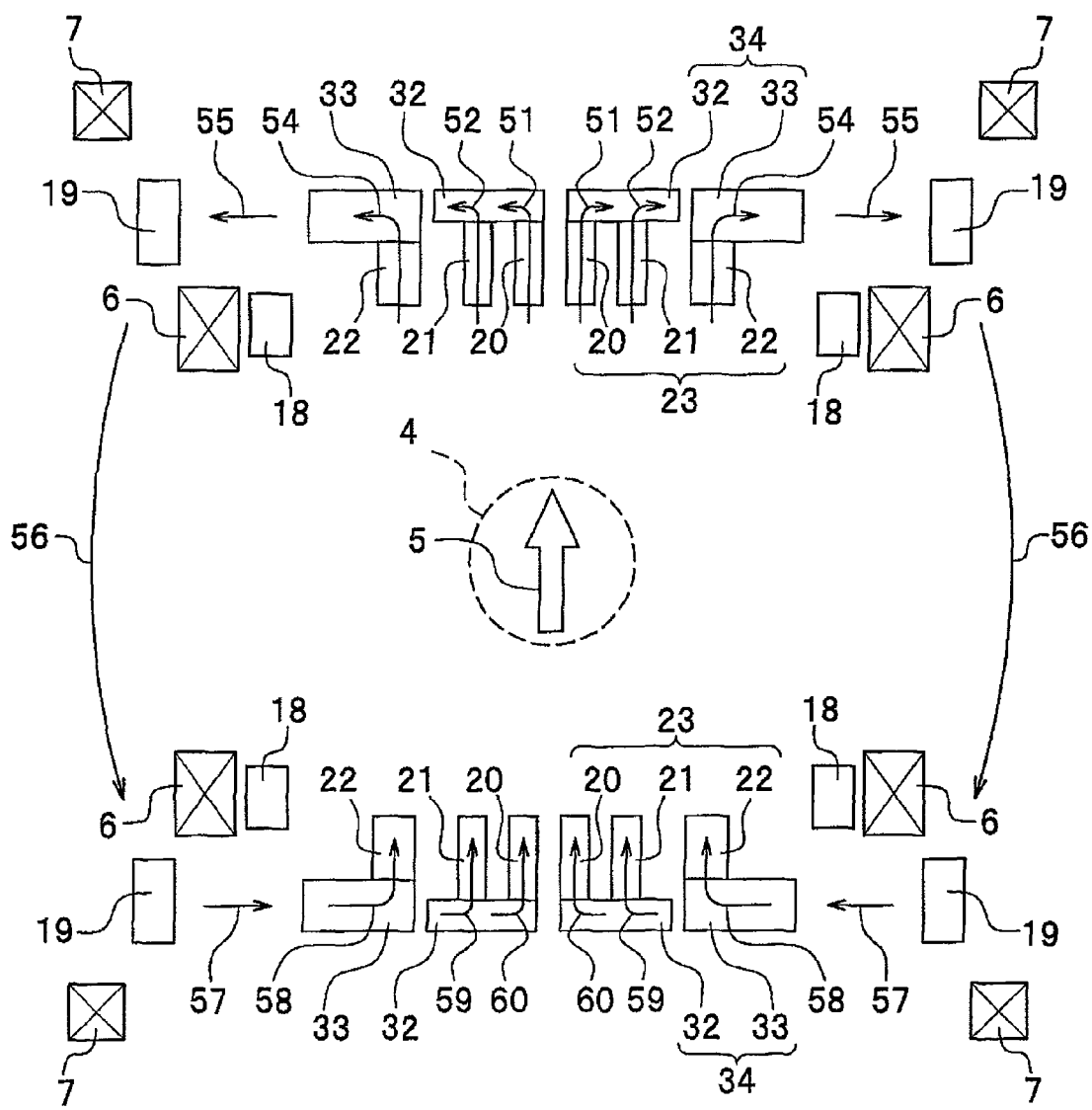
FIG. 5 is a drawing showing magnetic flux lines generated in an electromagnet apparatus.

In FIG. 5 is shown an appearance of magnetic flux lines according to the present invention. FIG. 5 shows only the superconductive main coils 6, the superconductive shielding coils 7, the first ferromagnetic members 23, the second ferromagnetic members 34, the third ferromagnetic members 18, and the fourth ferromagnetic members 19 in FIG. 2. It is thought that magnetic circuits are configured in the electromagnet apparatuses 1 from the arrow mark 5 to the arrow mark 5 via the branched arrow marks 51, 52, and 54, via the converged arrow marks 55, 56, and 57, finally via branched arrow marks 58, 59, and 60. The magnetic flux lines of the arrow marks 55 radiated from the upper circular ring 33 proceed in directions of the upper fourth ferromagnetic member 19; magnetic flux lines in directions of the arrow marks 56 are generated between the pair of the ferromagnetic members 19; and magnetic flux lines in directions of the arrow marks 57 approach from directions of the lower fourth ferromagnetic member 19 so as to enter the lower circular ring 32. Because the magnetic flux lines of the arrow marks 57 entered from the lower circular ring 32 are lowered to a same extent in magnetic resistance due to the circular rings 32 and 33, the flux lines are thought to be distributed to those of the arrow marks 58, 59, and 60 in magnetic flux density of a same extent.

Thus by using the second ferromagnetic members 34, it becomes possible to lower a magnetic resistance in a radial direction in a magnetic circuit configured in the electromagnet apparatuses 1, and magnetic flux lines are permeated through the members 34 and led to the directions of the central axis 10 of the apparatuses 1. In order to achieve this, it suffices to increase a lightweight ferromagnetic member as the second ferromagnetic members 34.

Furthermore, although it is generally requested to increase current values of the superconductive main coils 6 and the superconductive shielding coils 7 in order to increase a magnetic field strength in the electromagnet apparatuses 1, also a leakage magnetic field results in being increased in proportion to the current values. In the first embodiment, because the leakage magnetic field is reduced, it is possible to increase the current values and intensify the magnetic field strength of the homogeneous magnetic field region 4 with maintaining the magnetic flux density to be not more than five gauss of a reference value of the leakage magnetic field.

Second Embodiment

Figure 6:
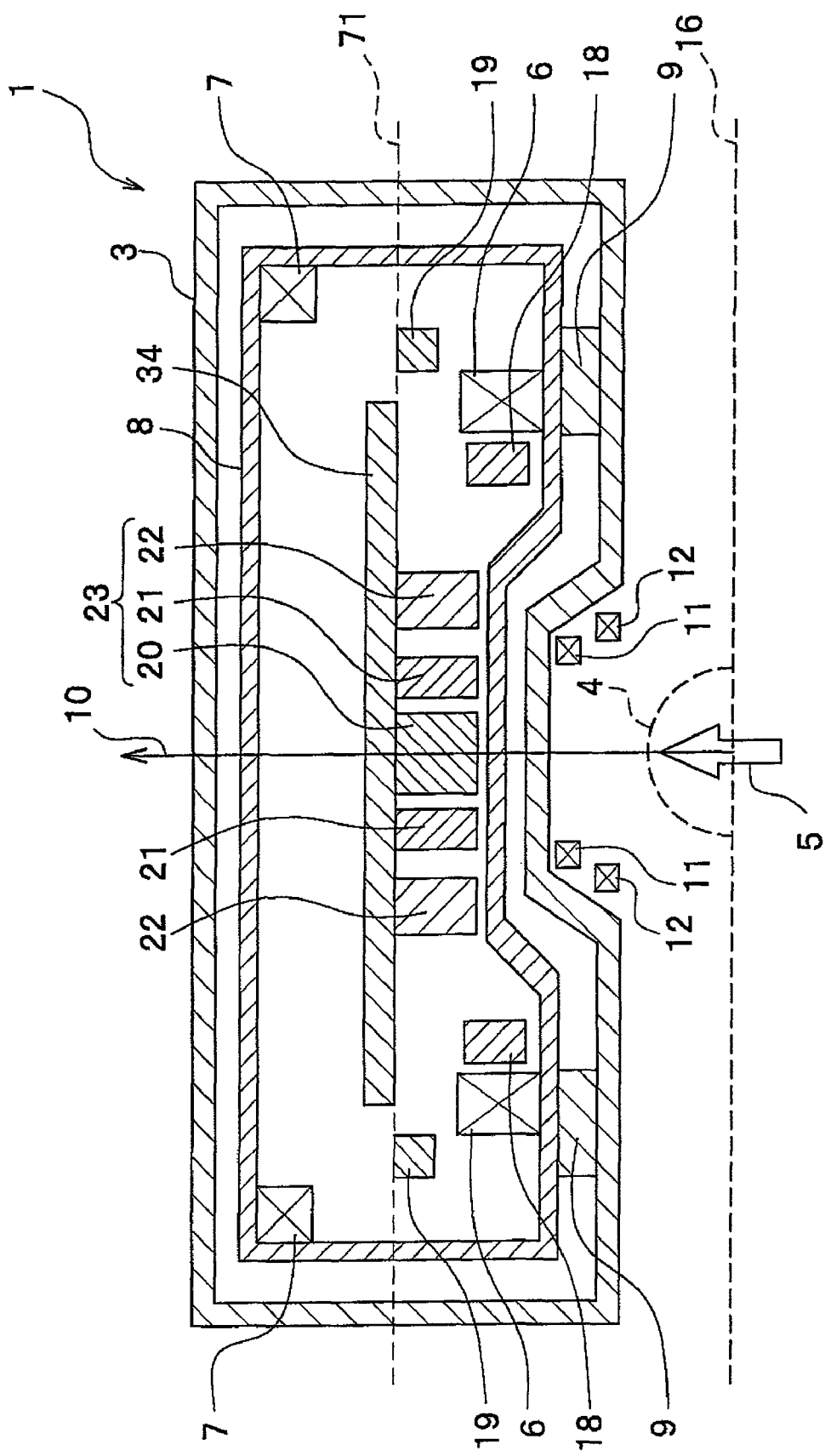
FIG. 6 shows an upper half of an electromagnet apparatus used in a magnetic resonance imaging system with respect to a second embodiment of the present invention and is the section view in the II-II direction of FIG. 1.
Figure 7A:
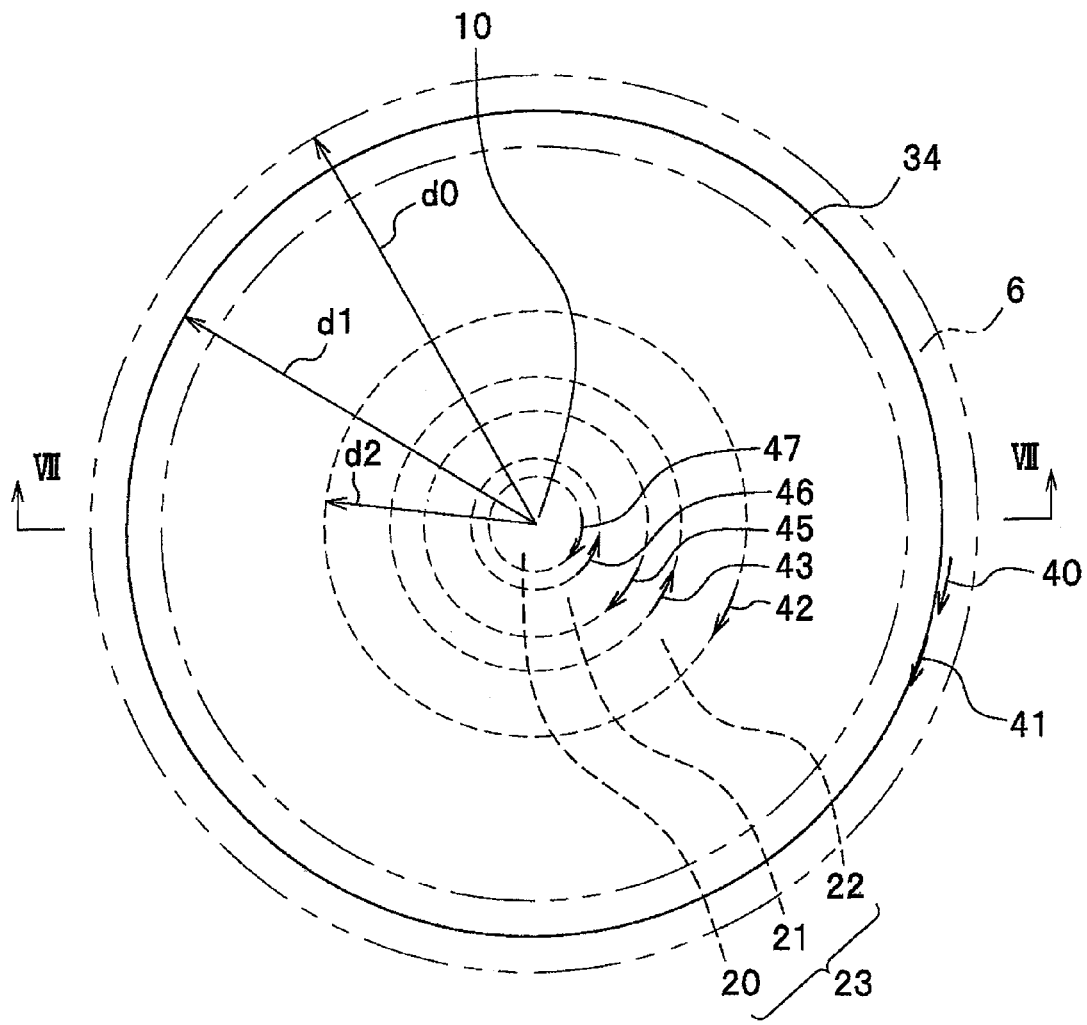
FIG. 7A shows a top view of a first ferromagnetic member and second ferromagnetic member of the upper half electromagnet apparatus with respect to the second embodiment.
Figure 7B:
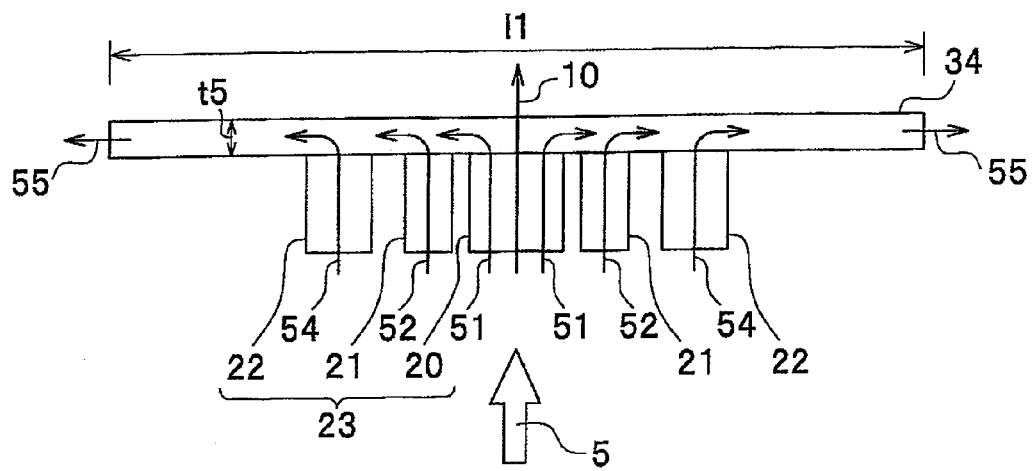
FIG. 7B is a section view in a VII-VII direction of FIG. 7A.

As shown in FIGS. 6, 7A, and 7B, an MRI system with respect to a second embodiment of the present invention is different in a point that the second ferromagnetic member 34 is a disc, compared to the MRI system of the first embodiment in FIGS. 3, 4A, and 4B; accordingly, different in a point that the circular ring 20 of the first ferromagnetic member 23 is a disc.

According to this, not only the effect obtained in the first embodiment is obtained, but also the second ferromagnetic member 34 is integrated; therefore, the radial direction length l1 of the disc of the member 34 can be enlarged, and thus it is possible to enlarge the ratio (l1/t5) of the length l1 to thickness t5 of the disc. In other words, it is possible to lead the magnetic flux lines entered from the arrow marks 51, 52, and 54 to the arrow marks 55 without further leaking the flux lines. Thus it is possible to magnetically saturate the circular rings 32, 33. Furthermore, because the second ferromagnetic member 34 is integrated, it is possible to further strengthen a magnetic coupling, to reduce the leakage of the magnetic flux lines, and to suppress a leakage magnetic field. Furthermore, it is thought that the magnetic resistance of the magnetic paths (magnetic paths from the arrow marks 51 to 55) via the circular ring 20 of the first ferromagnetic member 23 is further reduced and becomes almost as small as a magnetic resistance of the magnetic paths (magnetic paths from the arrow marks 54 to 55) via the circular ring 22 of the first ferromagnetic member 23. Similarly, it is thought that a magnetic resistance of the magnetic paths (magnetic paths from the arrow marks 52 to 55) via the circular ring 21 of the first ferromagnetic member 23 is further reduced and becomes almost as small as the magnetic resistance of the magnetic paths via the circular ring 22 of the first ferromagnetic member 23. Accordingly, between the magnetic paths via the circular ring 20, via the circular ring 21, and via the circular ring 22 of the first ferromagnetic member 23, the magnetic resistances are in the same level, and the magnetic flux lines are equally distributed in these three magnetic paths. Thus it is possible to make a magnetic field strength homogeneous regardless of a distance from the superconductive main coil 6. Because it is possible to homogeneously increase the magnetic field strength by increasing the current of the superconductive main coil 6, it is possible to magnetically saturate all of the circular rings 20, 21, and 22, to thereby lessen a magnetization variation of a ferromagnetic member due to a magnetic unsaturation, and to shorten working hours for shimming.

Thus by using the second ferromagnetic member 34, it becomes possible to further lower a magnetic resistance in a radial direction in a magnetic circuit configured in the electromagnet apparatuses 1, and magnetic flux lines are permeated through the member 34 and led to the directions of the central axis 10 of the apparatuses 1.

Third Embodiment

Figure 8:
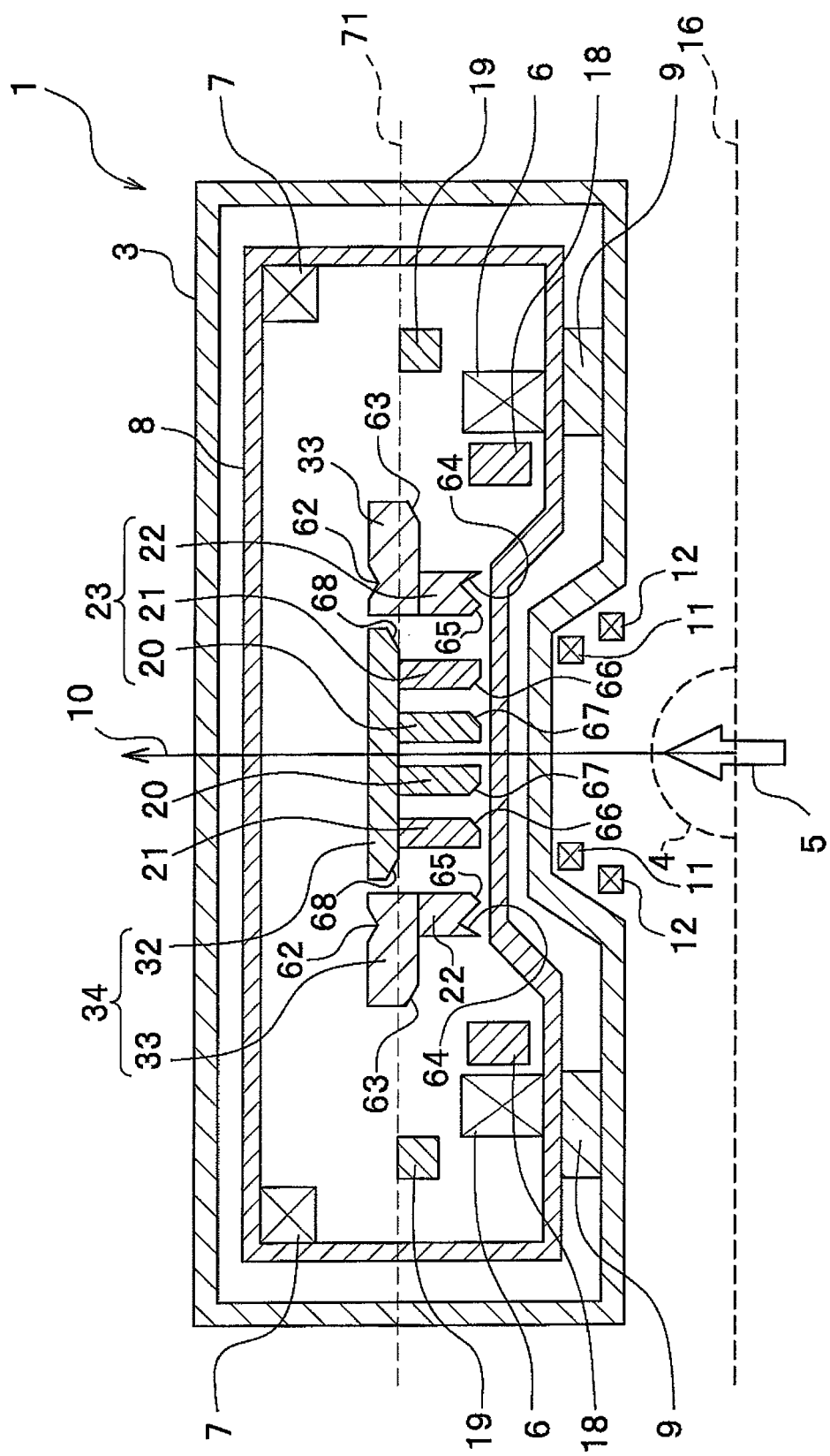
FIG. 8 shows an upper half of an electromagnet apparatus used in a magnetic resonance imaging system with respect to a third embodiment of the present invention and is the section view in the II-II direction of FIG. 1.
Figure 9A:
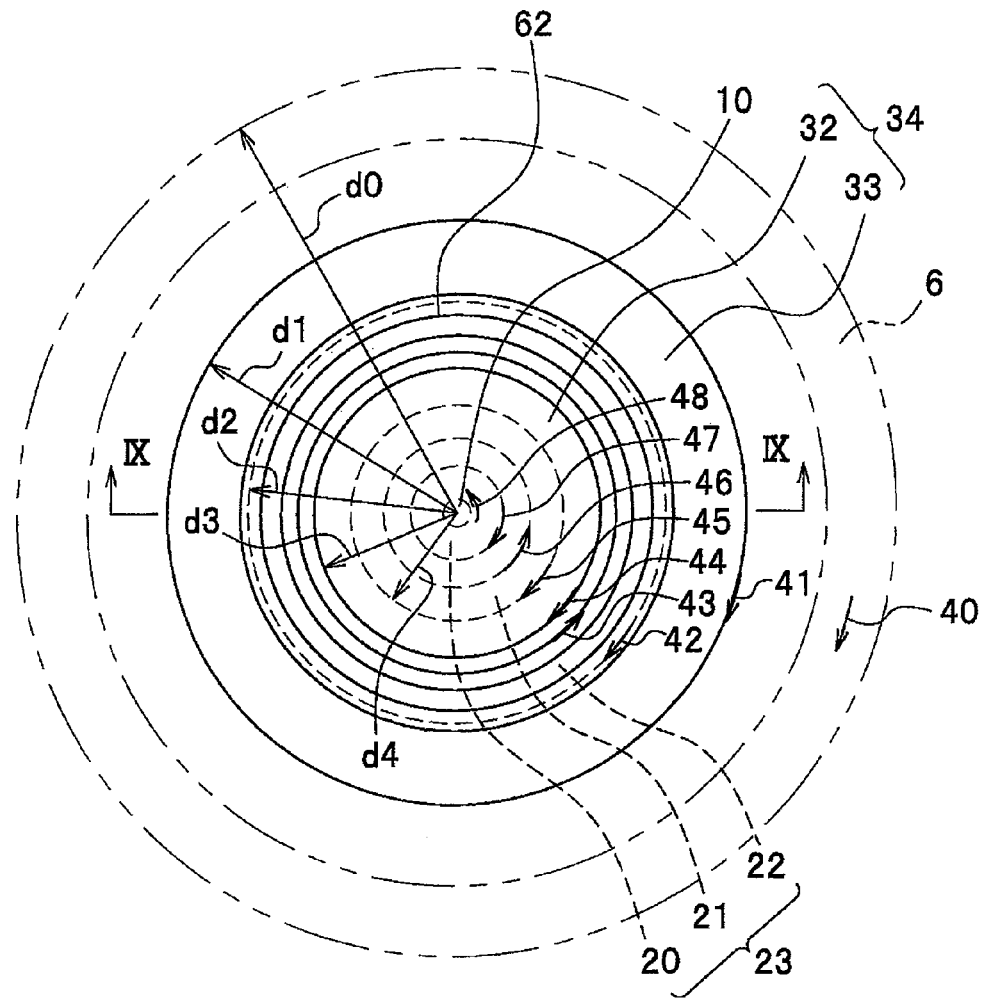
FIG. 9A shows a top view of a first ferromagnetic member and second ferromagnetic member of the upper half electromagnet apparatus with respect to the third embodiment.
Figure 9B:
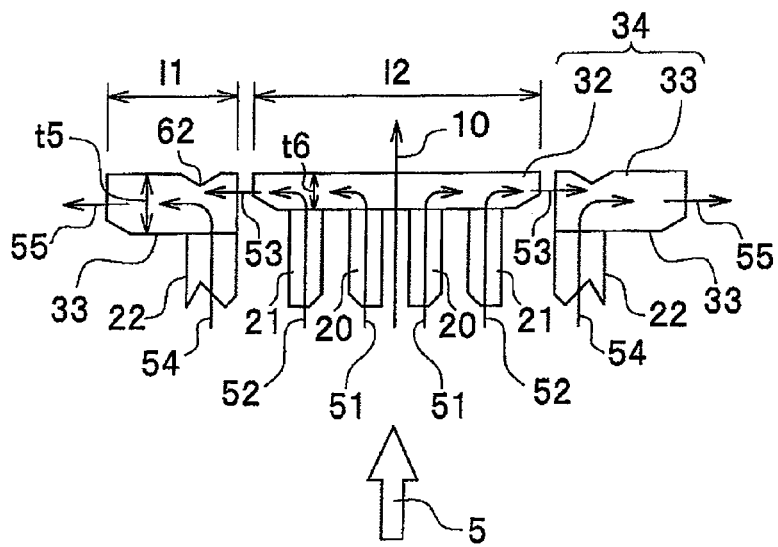
FIG. 9B is a section view in a IX-IX direction of FIG. 9A.

As shown in FIGS. 8, 9A, and 9B, an MRI system with respect to a third embodiment of the present invention is different in a point that depressions 62, 64, a protrusion 65, and tapers 63, 66, 67, and 68 are dispensed at least on one surface of the first ferromagnetic member 23 and the second ferromagnetic member 34, compared to the MRI system of the first embodiment in FIGS. 3, 4A, and 4B; moreover, different in a point that the circular ring 32 of the second ferromagnetic member 34 is a disc. Also according to this, not only the effect obtained in the first embodiment is obtained, but also it is possible to modify a local inhomogeneity of a magnetic field and to further enhance a magnetic field homogeneity.

Fourth Embodiment

Figure 10:
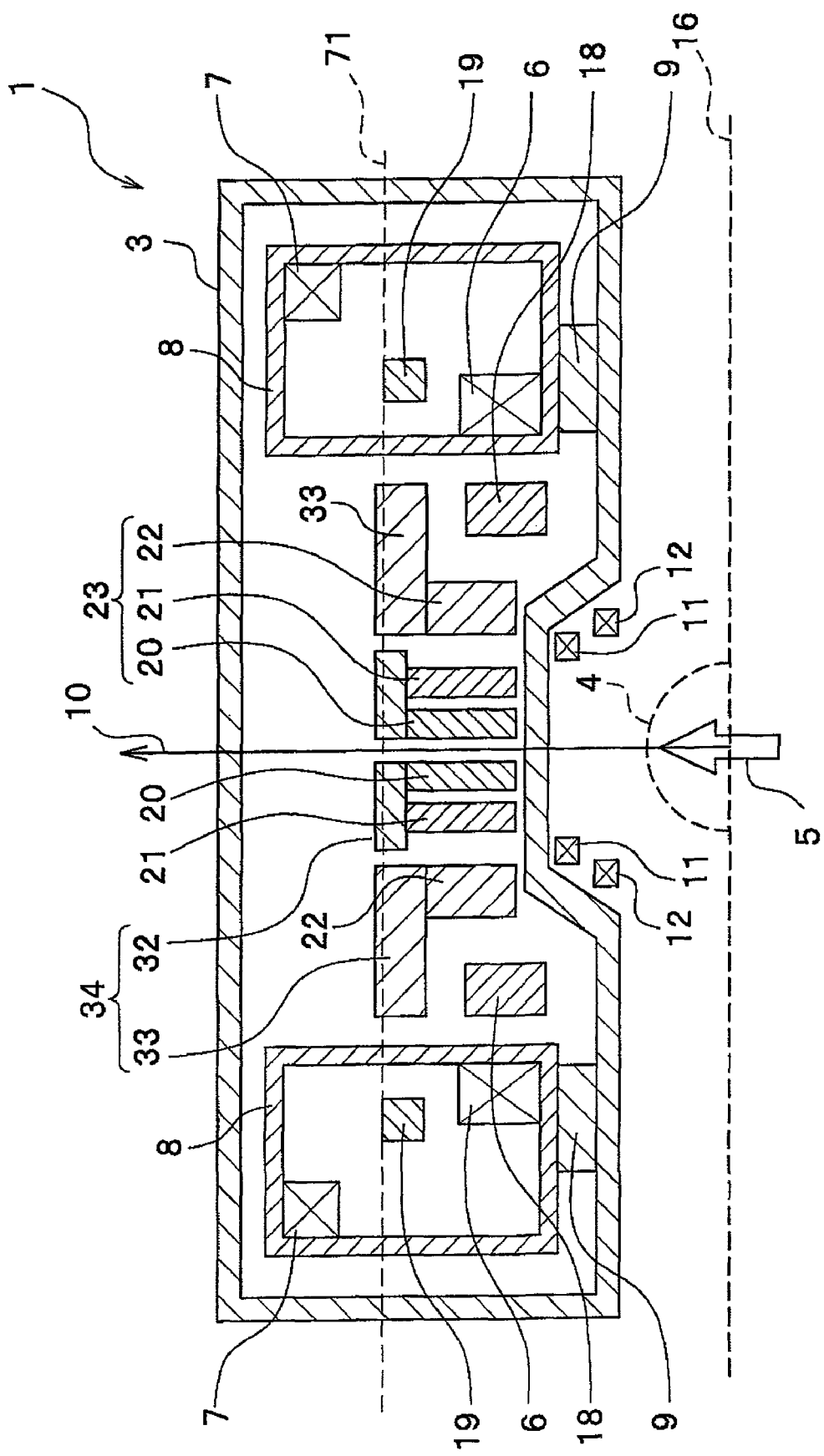
FIG. 10 shows an upper half of an electromagnet apparatus used in a magnetic resonance imaging system with respect to a fourth embodiment of the present invention and is the section view in the II-II direction of FIG. 1.

As shown in FIG. 10, an MRI system with respect to a fourth embodiment of the present invention is different in a point that the first ferromagnetic member 23, the second ferromagnetic member 34, and the third ferromagnetic member 18 are disposed outside the cryogenic vessel 8, compared to the MRI system of the first embodiment in FIG. 3. Accordingly, because it suffices that the cryogenic vessel 8 can house only the superconductive main coil 6, the superconductive shielding coil 7, and the fourth ferromagnetic member 19, a volume of the vessel 8 is smaller. Then because an amount of a refrigerant can be reduced, it is possible to make a cooling capacity of a cooler smaller and to make the MRI system more lightweight. In addition, also according to the fourth embodiment, the effect obtained by the first embodiment can be obtained.

What is claimed is:

1. Electromagnet apparatuses configured to generate a homogeneous magnetic field in a homogeneous magnetic field region having a pair of cryogenic vessels between which the homogeneous magnetic field region is interposed, the pair of cryogenic vessels lying along and intersecting a central axis passing through the homogeneous magnetic field region; each of the pair of cryogenic vessels including a superconducting main coil placed opposite each other and a superconductive shielding coil placed opposite each other, between which the homogeneous magnetic field region is interposed, and for passing a current in a direction reverse to a current of the superconductive main coil; each of the pair of cryogenic vessels having a first side nearest to the homogenous magnetic field region and a second side opposite the first side;

a pair of first ferromagnetic members, each comprising one or more ferromagnetic materials, placed opposite each other along the central axis and within the pair of cryogenic vessels, each of the pair of first ferromagnetic materials having first sides closest to the first sides of the cryogenic vessels and having second sides opposite the first sides, wherein an outer periphery of the pair of first ferromagnetic members is a circle;

a pair of second ferromagnetic members, each comprising one or more ferromagnetic materials, configured opposite each other along the central axis and within the pair of cryogenic vessels, and adjacent to the second side of each of the first ferromagnetic members relative to the homogeneous magnetic field region, respectively, wherein an outer periphery of the pair of second ferromagnetic members is a circle of which a diameter is larger than a diameter of the circle of the first ferromagnetic members.

2. The electromagnet apparatuses according to claim 1, wherein each of the superconductive main coils and the superconductive shielding coils, which share a central axis, is a circular ring, and wherein each of the second ferromagnetic members includes a first member which is either a circular ring or a disc disposed in a center region and a second member which is a circular ring disposed at a periphery of the center region so that each of the second ferromagnetic members includes a plane which is perpendicular to the central axis.

3. The electromagnet apparatuses according to claim 2, wherein a ratio of a radial direction length of any one of the circular ring and disc of the second ferromagnetic members to a thickness of any one of the circular ring and disc of the second ferromagnetic members is equal to one or more.

4. The electromagnet apparatuses according to claim 1, wherein the first ferromagnetic members and the second ferromagnetic members are joined at the second side of each of the first ferromagnetic members.

5. The electromagnet apparatuses according to claim 1, wherein the cryogenic vessels are configured to cool the superconductive main coils and the superconductive shielding coils, the electromagnet apparatuses further comprising:
vacuum vessels configured to respectively include the cryogenic vessels and configured to insulate the cryogenic vessels from outside.

6. The electromagnet apparatuses according to claim 1, wherein a depression, a protrusion, and a taper are dispensed at least on one surface of the first ferromagnetic members and the second ferromagnetic members.

7. The electromagnet apparatuses according to claim 2, wherein a space between the first member and the second member of each of the second ferromagnetic members is a vacuum or is filled with a nonmagnetic member.

8. The electromagnet apparatuses according to claim 2, wherein the central axis is a common central axis of any of the circular ring and the disc of the second ferromagnetic members.

9. The electromagnet apparatuses according to claim 1, wherein the second ferromagnetic members are respectively disposed at positions relative to the first sides of the cryogenic vessels to be between relative positions of superconductive main coils and the superconductive shielding coils.

10. The electromagnet apparatuses according to claim 2, wherein any of an outer diameter of the circular ring of the second ferromagnetic members and a diameter of the disc of the second ferromagnetic members is smaller than an outer diameter of a circular ring of the superconductive main coils.

11. The electromagnet apparatuses according to claim 1, wherein each cryogenic vessel further comprises a third ferromagnetic member of a circular ring shape and configured to be respectively disposed outside the first ferromagnetic members and inside the superconductive main coils relative to the central axis and are disposed opposite each other, wherein the homogeneous magnetic field region is interposed between the third ferromagnetic members.

12. The electromagnet apparatuses according to claim 1, wherein each cryogenic vessel further comprises a fourth ferromagnetic member of a circular ring shape disposed opposite each other and configured to be respectively disposed outside the second ferromagnetic members relative to the central axis and at positions relative to the first sides of the cryogenic vessels to be between relative positions of the superconductive main coils and the superconductive shielding coils, wherein the homogeneous magnetic field region is interposed between the fourth ferromagnetic members.

13. The electromagnet apparatuses according to claim 2, wherein each of the first ferromagnetic members comprises a first circular ring, a second circular ring disposed inside the first circular ring, and any one of a third circular ring and a first disc disposed inside the second circular ring.

14. The electromagnet apparatuses according to claim 13, wherein any of the first member or the second member of the second ferromagnetic members is in contact with or adjacent to the first circular ring, the second circular ring, and any one of the third circular ring and the first disc of the first ferromagnetic members.

15. The electromagnet apparatuses according to claim 13, further comprising a pair of fourth ferromagnetic members configured to be in contact with or adjacent to the first circular ring of the first ferromagnetic members, and either the first member or the second member of the second ferromagnetic members is adjacently disposed inside the fourth ferromagnetic member and is in contact with or adjacent to the second circular ring and any one of the third circular ring and the first disc of the first ferromagnetic members.

16. A magnetic resonance imaging system using the electromagnet apparatuses according to claim 1.

* * * * *